(12) United States Patent
Huang

(10) Patent No.: US 6,507,121 B2
(45) Date of Patent: Jan. 14, 2003

(54) ARRAY STRUCTURE OF SOLDER BALLS ABLE TO CONTROL COLLAPSE

(75) Inventor: Chien-Ping Huang, Hsinchu Hsien (TW)

(73) Assignee: Siliconware Precision Industries Co., Ltd., Taichung Hsien (TW)

(*) Notice: Subject to any disclaimer, the term of this patent is extended or adjusted under 35 U.S.C. 154(b) by 3 days.

(21) Appl. No.: 09/756,086

(22) Filed: Jan. 8, 2001

(65) Prior Publication Data

US 2002/0017721 A1 Feb. 14, 2002

(51) Int. Cl.⁷ .............................................. H01L 23/48
(52) U.S. Cl. ................ 257/780; 257/778; 257/779; 257/772; 257/776; 257/723; 257/724; 257/738
(58) Field of Search ................................ 257/778, 779, 257/780, 772, 776, 723, 724, 738

(56) References Cited

U.S. PATENT DOCUMENTS 5,239,198 A * 8/1993 Lin et al. .................... 257/693
5,539,153 A * 7/1996 Schwiebert et al. ........ 174/260
5,841,198 A * 11/1998 Chia et al. .................. 257/780
5,872,400 A * 2/1999 Chapman et al. ........... 257/738

* cited by examiner

Primary Examiner—Kamand Cuneo
Assistant Examiner—Luan Thai
(74) Attorney, Agent, or Firm—J.C. Patents

(57) ABSTRACT

A solder ball array type package structure is able to control collapse. The package includes a substrate, a carrier, a plurality of dies, a molding compound and a plurality of solder balls. The substrate has at least one active surface. Pads are located on the first surface of the substrate. The carrier has at least an active surface and a back surface opposite the active surface. A plurality of dies are located on the back surface and the active surface of the carrier. The dies arranged on the active surface are electrically connected to the carrier by flip chip technology. A molding compound encapsulates on the back surface of the carrier to cover the dies on the back surface of the carrier. Solder balls having a base material are provided on the active surface of the carrier in array. At least three solder balls coated with the base material having a high melting-temperature core are further provided in the periphery of the array. The carrier is arranged such that the active surface faces the first surface of the substrate to allow each solder ball correspond to the one of the pads, respectively.

9 Claims, 4 Drawing Sheets

ARRAY STRUCTURE OF SOLDER BALLS ABLE TO CONTROL COLLAPSE

BACKGROUND OF THE INVENTION

1. Field of the Invention

The present invention relates to an array structure of solder balls able to control collapse, specifically, to an array structure of solder balls for a BGA package which can control collapse.

2. Description of the Related Art

Integrated circuits plays an important role in current daily life. With increasing development in electronics, electronic products having humanized operation and higher performance are available. Additionally, various products are designed such that the features such as lesser weight and compact size are provided for comfortable use. In the semiconductor fabricating process, a semiconductor product having higher integration is available because of mass production of the 0.18 micrometer integrated circuit.

In general, the production of an integrated circuit (IC) includes three stages: silicon wafer production, semiconductor process and IC packaging.

Owing to the design trend always tends to lighter, thinner, shorter and smaller products, various technologies for packages have been developed. Many fine packages such as chip scale package (CSP), wafer level package or multiple chip module (MCM) are manufactured. In device assembly, a multi-level PCB having higher density can be used to allow the IC package to be arranged on the PCB more compactly.

Because the device with more complex function is developed, the amount of input/output pads for an IC package increases. Owing to shrink the package size, it trends to layout the input/output pads in an area array. Ball grid array package is a typical and popular package using area array in input/output pads layout.

A flip chip technology is often used for a chip scale package. Since bonding pads are arranged in area array, a chip is attached to a carrier through bumps, and solder balls are used to connect the carrier to a substrate in the flip chip technology, the package size and signal transmission path can be reduced. Among the current flip chip products, Ball Grid Array (BGA) package is a common one.

Referring to FIGS. 1A and 1B, cross-sectional views of a conventional area array type package structure are shown.

As shown in FIG. 1A, pads 104 are formed on a substrate 102 as junctions for external connection. A carrier 106 comprises at least an active surface 101 and a plurality of solder balls 108 are provided thereon.

As shown in FIG. 1B, the solder balls 108 on the active surface of the carrier 106 are attached to the pads 104 of the substrate 102, respectively. At the reflowing step, the eutectic solder balls 108 are melted into solder and wetting to pads 104 of the substrate 102. As the area 124 for wetting becomes larger, the level of collapse becomes serious. I.e., if the height 122 of the solder ball 108 is lowered, the standoff between the carrier 106 and the substrate 102 is reduced. In case of serious collapse, the standoff between the carrier 106 and the substrate 102 is so small that the adjacent solder balls 108 becomes short to influence adversely the yield.

Some packages which require high accuracy for the standoff between the carrier 106 and the substrate 102, such as cavity down BGA or package having chips thereunder, usually result in low yield due to uncontrolled collapse. The extremely small standoff between the carrier 106 and the substrate 102 generated from undue collapse often makes the solder ball structure with solder joints bad and the endurance for the thermal cycle insufficient.

Therefore, it is one object of the present invention to provide a solder ball array type package structure in which the standoff between the carrier and the substrate can be improved and the level of collapse can be controlled.

It is another object of the present invention to provide a solder ball array type package structure in which the reliability of solder joint can be strengthened in thermal cycle.

It is still another object to provide a structure of solder ball array in which short connection to adjacent solder balls can be prevented and the level of collapse can be controlled.

According to the present invention, a solder ball array type package structure able to control the collapse is provided, comprising at least: a substrate, a carrier, a plurality of dies, a molding compound and a plurality of solder balls. The substrate has a first surface. Pads are provided on the first surface of the substrate. The carrier has at least an active surface and a back surface opposite the active surface. A plurality of dies are provided on the back surface and the active surface of the carrier. The dies are arranged on the active surface by flip chip technology. A molding compound overlies on the back surface of the carrier to cover the dies on the back surface of the carrier. Solder balls including base material are provided on the active surface of the carrier in array. In the periphery of the array are provided at least three solder balls, each further having a core of a high melting point (hereinafter, called as "high-melting-temperature" or "HMT" core). The carrier is arranged such that the active surface faces the first surface of the substrate to allow each solder ball correspond to one of the pads, respectively.

According to one preferred embodiment of the present invention, at least three solder balls further having a high-melting-temperature core are provided in the periphery of the solder ball array structure of the present invention to control the collapse of the solder ball and thus ensure the standoff between the carrier and the substrate. The electrical connection of the pads and solder balls on the substrate can be achieved. During the reflowing process, the carrier is supported by the solder balls having high-melting-temperature cores, so that the collapse level is controlled. Then, the short situation of the adjacent solder balls is prevented.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1A:
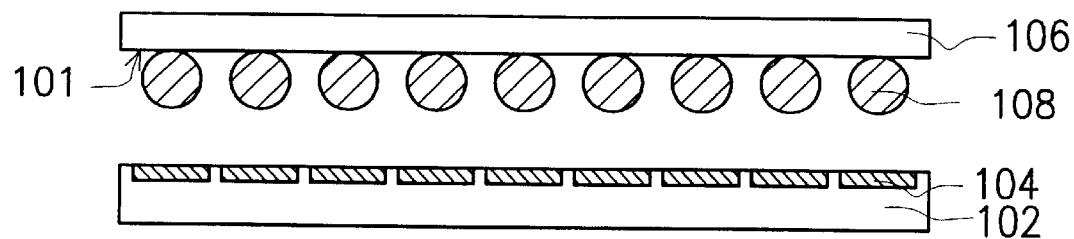
FIGS. 1A and 1B are schematic, cross-sectional views of a conventional flip chip type package structure.
Figure 1B:
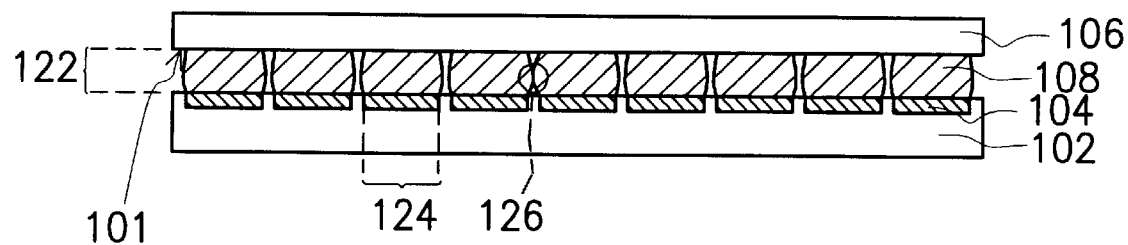
Figure 2A:
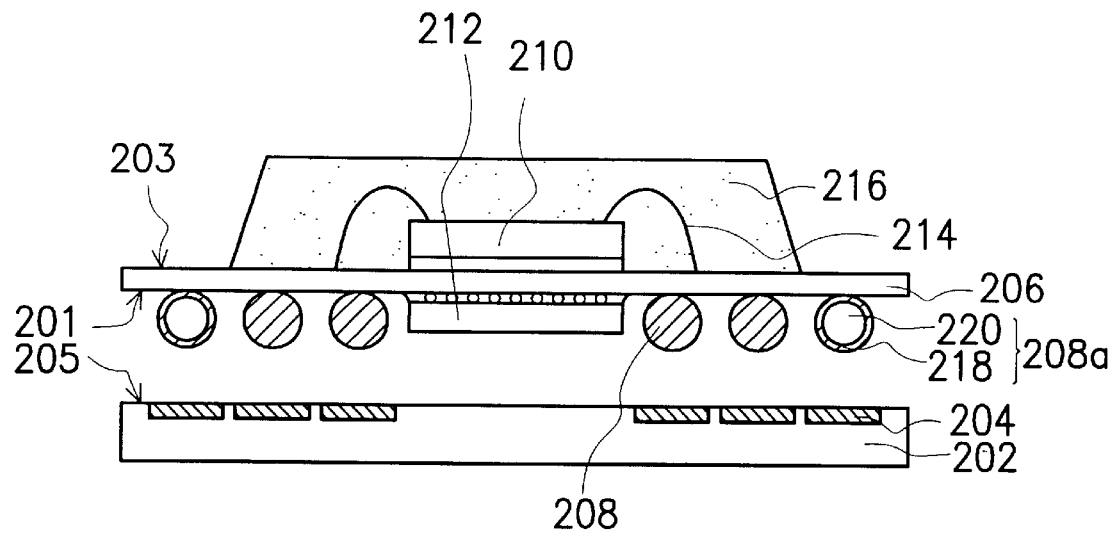
FIGS. 2A and 2B are schematic, cross-sectional views of an solder ball array type package structure able to control the collapse according to the first embodiment of the present invention.
Figure 2B:
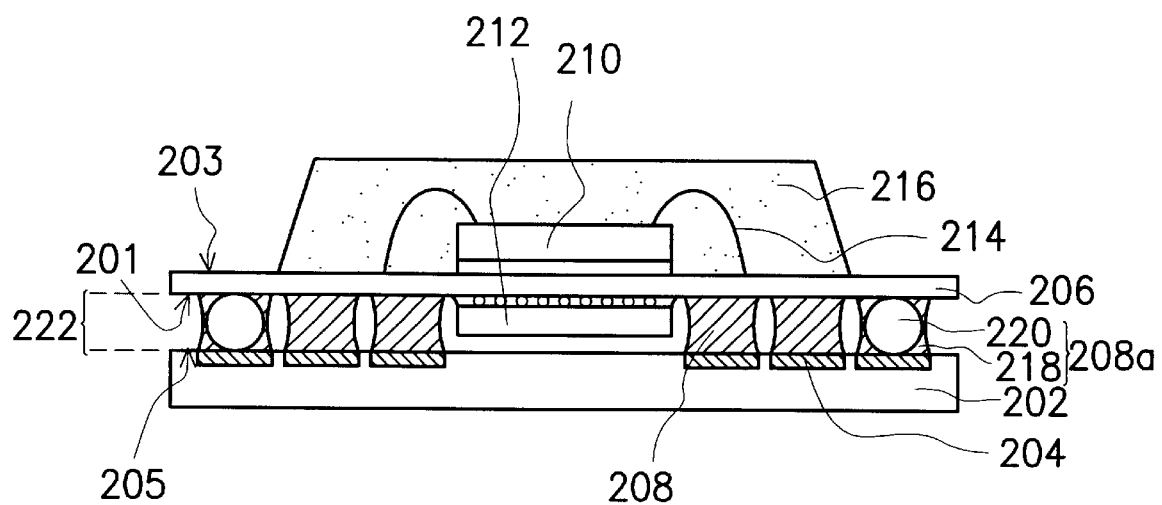

Referring to FIGS. 2A and 2B, schematic, cross-sectional views of a solder ball array type package structure according to the first embodiment of the present invention are shown.

As shown in FIG. 2A, a substrate 202, such as a Printed Circuit Board (PCB), comprises at least a first surface 205. Pads 204 constructed of a material such as copper are provided on a first surface 205 of the substrate 202. A carrier 206 comprises at least an active surface 201 and a back surface 203 opposite the active surface 201. A first die 210 is provided on the back surface 203 of the carrier 206. The first die 210 is electrically connected to the back surface 203 of the carrier 206 by wires 214. A second die 212 is provided on the active surface 201 of the carrier 206 and the second die 212 is electrically connected to the carrier 206 by flip chip technology. A molding compound 216, such as epoxy, is encapsulated on the back surface 203 of the carrier 206 and the first die 210 and the wires 214 thereon.

Solder balls 208 are provided on the active surface 201 of the carrier 206 in array. The solder balls 208 includes at least one base material 218. If the base material 218 is eutectic lead/tin alloy which of a melting point of 183° C., then the lead/tin ratio is about 37/63. At least three solder balls 208a coated with a base material 218, each having a high-melting-temperature core (HMT core) 220, are provided in the periphery of the array. The HMT core 220 is made of lead-rich alloy, dummy ball, copper, lead/tin alloy or the like. For example, when the HMT core 220 is lead/tin alloy and its melting point is 240° C., the ratio of lead to tin is about 90/10.

As shown in FIG. 2B, the carrier 206 is arranged such that the active surface 201 faces the first surface 205 of the substrate 202 to allow each solder ball 208 to correspond to one of the pads 204, respectively. Reflowing process is then carried out. Because the solder balls 208 made of the base material 218 has a lower melting point than HMT cores 220 of the solder balls 208a, the HMT cores 220 can maintain the distance between the carrier 206 and the substrate 202 and allow wetting of the solder balls 208 and the pads 204 on the substrate 202 when the base material 208 starts to melt. Therefore, collapse can be controlled, that is, the solder balls 208 have larger height 222 such that the structure of the solder balls 208 as a solder joint for the carrier 206 and the pads 204 has a better strength, hence, larger endurance for the thermal stress generated during the thermal cycle can be reached. The adjacent solder balls 208 can be further prevented from being short, and the yield can thus be improved.

Figure 3A:
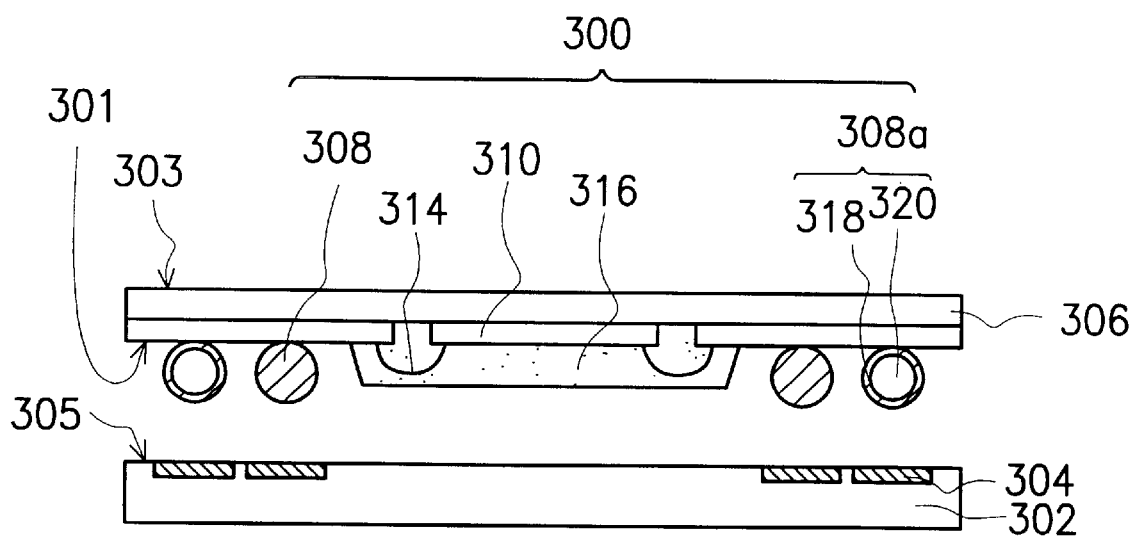
FIGS. 3A and 3B are schematic, cross-sectional views of a solder ball array type package structure able to control the collapse according to the second embodiment of the present invention.
Figure 3B:
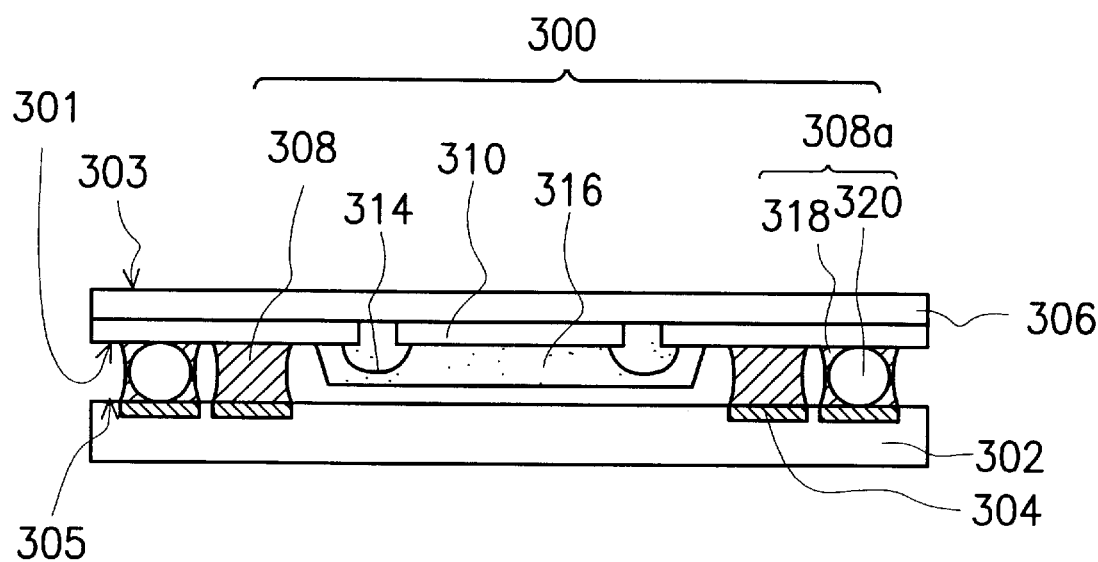

Referring to FIGS. 3A and 3B, schematic, cross-sectional views of solder ball structure according to the second preferred embodiment of the present invention are shown.

As shown in FIG. 3A, a substrate 302 comprises at least a first surface 305. Pads 304 are provided on the first surface 305 of the substrate 302. A carrier 306 comprises at least an active surface 301 and a back surface 303 opposite the active surface 301. A cavity down BGA comprises at least a die 310, a plurality of wires 314, a molding compound 316 and a plurality of solder balls 308. A die 310 is provided on the active surface 301 of the carrier 306 and electrically connected to the carrier 306 by wires 314. A molding compound 316 is encapsulated on the active surface 301 of the carrier 306. At least three solder balls coated with a base material 318 are further provided in the periphery of the array, each having HMT core 320.

As shown in FIG. 3B, the active surface 301 of the carrier 306 faces the first surface 305 of the substrate 302 to allow each solder ball 308 to correspond to the one of the pads 304, respectively. Reflowing is then carried out. Because the solder balls 308 made of the base material 318 has a lower melting point than HMT cores 320 of the solder balls 308a, the HMT cores 320 can maintain the distance between the carrier 306 and the substrate 302 and allow wetting of the solder balls 308 and the pads 304 on the substrate 302 when the base material 318 starts to melt. The collapse can be under control by the solder balls 308a, each having HMT cores 320 to avoid the molding compound 316 from contacting the substrate 302.

Figure 4A:
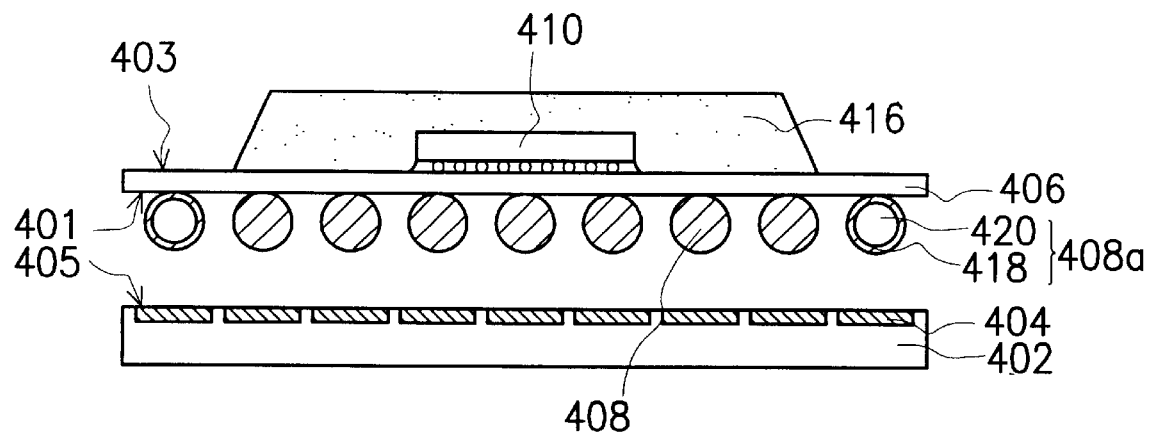
FIGS. 4A and 4B are schematic, cross-sectional views of a array type package structure able to control the collapse according to the third embodiment of the present invention.
Figure 4B:
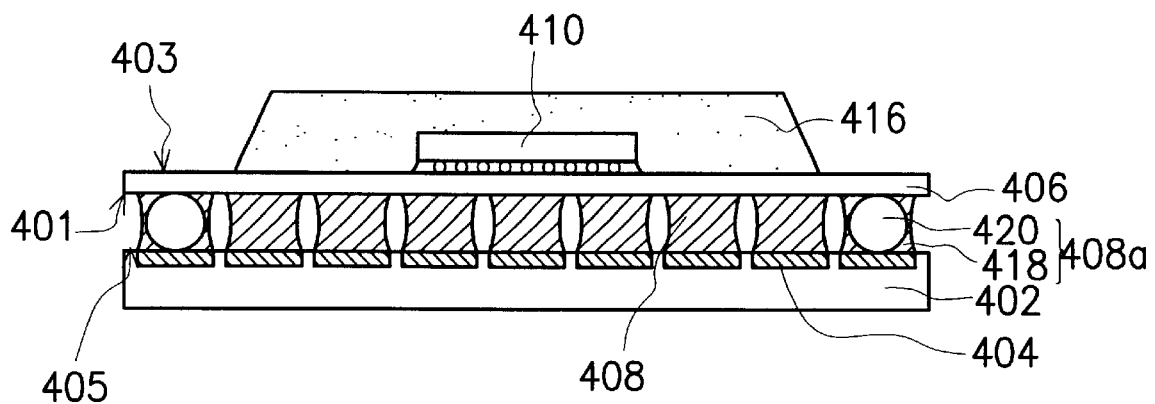

Referring to FIGS. 4A and 4B, schematic, cross-sectional views of a solder ball-type package structure that can control the collapse of the solder ball according to the third embodiment of the present invention are shown.

As shown in FIG. 4A, a substrate 402 comprises at least a first surface 405. Pads 404 are provided on the first surface 405 of the substrate 402. A carrier 406 comprises at least an active surface 401 and a back surface 403 opposite the active surface 401. Dies 410 are provided on the back surface 403 of the carrier 406 by flip chip technology. A molding compound 416 encapsulates the back surface 403 of the carrier 406 and the dies 410 thereon. Solder balls 408 are provided on the active surface 401 of the carrier 406 in an array layout. Moreover, at least three solder balls 408a coated with the base material 418 are further provided in the periphery of the array, each having a HMT core 420.

As shown in FIG. 4B, the carrier 406 is arranged such that the active surface 401 faces the first surface 405 of the substrate 402 to allow each solder ball 408 to correspond to the one of the pads 404, respectively. Reflowing process is then carried out. Because the solder balls 408a made of the base material 418 has a lower melting point than HMT core 420 of the solder balls 408a, the HMT core 420 can maintain the distance between the carrier 406 and the substrate 402 and allow wetting of the solder balls 408 and the pads 404 on the substrate 402 when the base material 418 starts to melt. Therefore, the collapse of the solder balls 408 can be controlled by arrangement of at least three solder balls 408a having HMT cores 420. The adjacent solder balls 408 can be further prevented from being short.

As mentioned above, a solder ball array type package structure able to control the collapse of the solder ball according to the present invention provides the advantages as follows:

1. In the periphery of the solder ball array structure are provided at least three solder balls, each having an HMT core, to control the collapse of the solder ball and thus maintain the distance between the carrier and the substrate.
2. The HMT cores can maintain the height for the eutectic solder balls and provide sufficient strength of the solder joint during a thermal cycle.
3. During the reflowing process, the collapse of solder balls can be controlled by arrangement the solder balls having HMT cores, such that the adjacent solder balls can be further prevented from being short.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A solder ball array type package structure able to control collapse, comprising at least:
   a substrate having at least a first surface;
   a plurality of pads provided on the first surface of the substrate;
   a carrier having at least an active surface and a back surface opposite the active surface;
   a molding compound encapsulating the back surface of the carrier and the dies thereon; and
   a plurality of solder balls each of which is made of a base material, wherein the solder balls are arranged on the active surface of the carrier in array;
   at least three peripheral solder balls provided in the periphery of the array, wherein each of peripheral solder balls is made of the base material with a high-melting-temperature core (HMT core) therein,
      wherein the carrier is arranged such that the active surface faces the first surface of the substrate to allow each solder ball correspond to one of the pads, respectively.

2. The solder ball array type package structure able to control collapse of claim 1, wherein the base material is eutectic lead/tin alloy.

3. The solder ball array type package structure able to control collapse of claim 2, wherein the base material is eutectic lead/tin alloy with a lead/tin ratio of about 37/63.

4. The solder ball array type package structure able to control collapse of claim 1, wherein the HMT cores of the solder balls are made of a material selected from a group consisting of copper or high lead/tin alloy.

5. The solder ball array type package structure able to control collapse of claim 4, wherein the HMT cores are high lead/tin alloy with a lead/tin ratio of about 90/10.

6. The solder ball array type package structure able to control collapse of claim 1, wherein the melting point of the base material is lower than that of the HMT core.

7. The solder ball array type package structure able to control collapse of claim 1, wherein the substrate is a printed circuit board.

8. The solder ball array type package structure able to control collapse of claim 1, wherein a material for the pads of the substrate is copper.

9. A solder ball array type package structure able to control collapse, comprising at least:
   a substrate having at least a first surface;
   a plurality of pads provided on the first surface of the substrate;
   a carrier having at least an active surface and a back surface opposite the active surface;
   a plurality of dies provided on the active surface and the back surface of the carrier, wherein the dies arranged on the active surface of the carrier are electrically connected to the carrier by flip chip technology;
   a molding compound encapsulating the back surface of the carrier and the dies thereon;
   a plurality of solder balls each of which is made of an eutectic base material, wherein the solder balls are arranged on the active surface of the carrier in array; and
   at least three peripheral solder balls provided in the periphery of the array, wherein each of the peripheral solder balls is made of the eutectic base material with a high-melting-temperature core therein,
      wherein the carrier is arranged such that the active surface faces the first surface of the substrate to allow each solder ball correspond to one of the pads, respectively.

* * * * *